(12) United States Patent
Faue

(10) Patent No.: US 8,594,114 B2
(45) Date of Patent: Nov. 26, 2013

(54) SHIELDING OF DATALINES WITH PHYSICAL PLACEMENT BASED ON TIME STAGGERED ACCESS

(75) Inventor: Jon Faue, Colorado Springs, CO (US)

(73) Assignee: ProMOS Technologies PTE. Ltd., Singapore (SG)

( * ) Notice: Subject to any disclaimer, the term of this patent is extended or adjusted under 35 U.S.C. 154(b) by 584 days.

(21) Appl. No.: 12/129,556

(22) Filed: May 29, 2008

(65) Prior Publication Data

US 2009/0300255 A1 Dec. 3, 2009

(51) Int. Cl.
*H04L 12/28* (2006.01)
*G11C 7/10* (2006.01)
*G11C 8/00* (2006.01)
*G11C 8/16* (2006.01)
*G06F 13/362* (2006.01)
*G06F 13/14* (2006.01)

(52) U.S. Cl.
USPC ............... 370/419; 365/189.05; 365/230.02; 365/233.13; 710/117; 710/305

(58) Field of Classification Search
USPC .......... 365/189.05, 230.02, 233.13; 370/419; 710/117, 305
See application file for complete search history.

(56) References Cited

U.S. PATENT DOCUMENTS

| | | | |
|---|---|---|---|
| 5,306,967 A | 4/1994 | Dow | |
| 5,994,946 A | 11/1999 | Zhang | |
| 6,304,479 B1 | 10/2001 | Vollrath et al. | |
| 6,414,542 B2 | 7/2002 | Lin et al. | |
| 6,456,137 B1 | 9/2002 | Asao | |
| 6,519,174 B2 | 2/2003 | Kirihara et al. | |
| 6,650,574 B2 | 11/2003 | Namekawa | |
| 6,714,554 B1 * | 3/2004 | Jin et al. | 370/412 |
| 6,717,839 B1 * | 4/2004 | Du | 365/145 |
| 6,765,413 B2 | 7/2004 | Nakase | |
| 6,784,688 B2 | 8/2004 | Khellah et al. | |
| 6,839,267 B1 | 1/2005 | Poechnueller | |
| 2005/0170673 A1 * | 8/2005 | Choi | 439/65 |
| 2007/0047376 A1 * | 3/2007 | Lovett et al. | 365/233 |

* cited by examiner

*Primary Examiner* — Hassan Phillips
*Assistant Examiner* — Lonnie Sweet
(74) *Attorney, Agent, or Firm* — William J. Kubida; Peter J. Meza; Hogan Lovells US LLP

(57) ABSTRACT

A bus driver circuit divides an internal data bus for an integrated circuit memory into at least two groups, designated by speed. A faster group of data lines and a slower group of data lines are placed in an interleaved fashion in order to provide a two group shielding solution. At the earliest opportunity following the reception of a read command, the data from memory banks in the memory is sorted into these two groups. For a DDR3 memory, the sorting method is based on the A2 column address, known as C2. All of the data is brought out of the banks in parallel and sorted as it enters the main amplifiers. These main amplifiers are also divided into two groups, faster and slower. Each amplifier then connects to a data line (G-line) of the same group. The clock assigned to the fast group fires right away, thereby connecting the data associated with the fast amplifiers to the fast data group. This data group then proceeds to the output buffers through the entire data path as fast as possible. The second, slower data group is started with a delayed clock signal and proceeds through the data path to the output buffer maintaining a fixed delay. Since the first and second data groups are not switching at the same time they act as shields to one another.

17 Claims, 11 Drawing Sheets

_US 8,594,114 B2_

SHIELDING OF DATALINES WITH PHYSICAL PLACEMENT BASED ON TIME STAGGERED ACCESS

CROSS REFERENCE TO RELATED PATENT APPLICATIONS

The present invention is related to the subject matter disclosed in U.S. patent application Ser. Nos. 11/625,744 filed Jan. 22, 2007, for SHIELDED BITLINE ARCHITECTURE FOR DYNAMIC RANDOM ACCESS MEMORY (DRAM) ARRAYS and 11/679,632 filed Feb. 27, 2007 for METHOD TO REGULATE PROPAGATION DELAY OF CAPACITIVELY COUPLED PARALLEL LINES assigned to ProMOS Technologies PTE.LTD, assignee of the present invention, the disclosures of which are herein specifically incorporated by this reference in their entirety.

BACKGROUND OF THE INVENTION

The present invention relates to integrated circuit memories and other types of integrated circuits and, more specifically, to a circuit and method for shielding long data lines from one another in the integrated circuit.

For a one giga-bit DDR3 DRAM the length of the internal data lines is so long that the inherent RC delays make it difficult to obtain the very aggressive DDR3 speed targets. Furthermore, the internal data bus is so wide, typically 64 or even 128 bits wide, that the data lines usually run together in a group. Thus, the situation where one data line is switching in a given direction surrounded by two data lines switching in the opposite direction results in a very slow data path. Referring now to FIG. 1, three closely spaced data lines 112, 114, and 116 are shown. The parasitic capacitance between the first and second data lines is shown as capacitor 102. The parasitic between the second and third data lines is shown as capacitor 104. The first data line 112 is designated Ia, the second data line is designated Ib, and the third data line is designated Ic. The corresponding data line waveforms are shown, wherein waveform 106 corresponds to data line Ia, waveform 108 corresponds to data line Ib, and waveform 110 corresponds to data line Ic. Note that waveforms 106 and 110 are switching with a positive step, whereas waveform 108 is switching with a negative step. Note that there is extra undesirable delay on the Ib waveform 108 since both adjacent waveforms 106 and 110 are switching in opposite directions at the same time.

As is shown in FIG. 1, one option to an integrated circuit designer is to use no shields at all, but this "solution" is slow due to the mutual capacitive coupling of adjacent lines switching at the same time.

Running a "shield", either a ground line or a line known not to be switching when the data lines are switching is one solution that is known to those skilled in the art, but this solution adds numerous extra lines and therefore adds chip area. Usually there are not enough "DC signal lines" to separate all the data lines, and adding power lines certainly adds area.

Running an internal bus that is half the width, but switches at twice the rate, and has "shields" is another solution known to those skilled in the art. This solution leads to no net increase in line slots, but the control and timing of such a scheme has proved difficult.

What is desired, therefore, is a shielding technique for a group of closely packed long data lines, but without the drawbacks of significantly increased chip area or significantly increased circuit complexity associated with known prior art circuits and methods.

SUMMARY OF THE INVENTION

According to the present invention, high frequency response performance in data line transmission is achieved without the addition of unnecessary shielding lines and their associated area penalty, or without significantly increased control circuit complexity.

According to the present invention, an internal data bus is divided into at least two groups, designated by speed. That is, a "Fast" group of data lines and a "Slow" group of data lines is proposed for a two group solution. At the earliest opportunity following the reception of a read command, the data from the memory banks is sorted into these two groups. For a DDR3 chip this is based on the A2 column address, which is known as C2. All of the data is brought out of the banks in parallel and sorted as it enters the main amplifiers. These main amplifiers are also divided into two groups, fast and slow. Each amplifier then connects to a data line (G-line) of the same group. The GCLK assigned to the fast group fires right away, thereby connecting the data associated with the fast amplifiers to the "fast data group". F-lines assigned to both C2=0 and C2=1 are multiplexed into each main amplifier to accomplish this. This group of data then proceeds through the G-Bus to the H-Bus, and then the I-bus, and finally to the output buffers as fast as possible. Various clocks control the flow of data along the way, but all these clocks are based on the initial "fast" GCLK and are configured to move the data as fast as possible. The data bus itself is laid out such that fast and slow data lines are interleaved. The GCLK assigned to the slow group fires with some delay after the fast one. This ensures that the slow G-lines are not switching when the fast ones are switching, and thus present no mutually destructive coupling. The assigned delay in the GCLKs has to be enough that the fast group has fully switched before the slow group starts, but short enough that the slow group sill arrives at the data buffer in time. The progression of data along the slow group is controlled by a series of clocks all based on the slow GCLK. Therefore, all along the entire flow of the data bus, the fast group and the slow group are never switching at the same time. Even the clocks that load the data into the output buffer FIFO register are based on different timing for the fast and slow groups, all derived from the difference in the initial fast versus slow GCLK timing.

DETAILED DESCRIPTION

Figure 1:
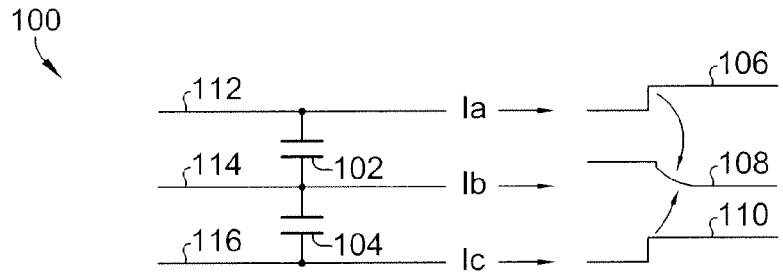
FIG. 1 is a schematic diagram of a set of three data lines according to the prior art, showing parasitic capacitances between the data lines, and the corresponding switching waveforms associated with the data lines.
Figure 2:
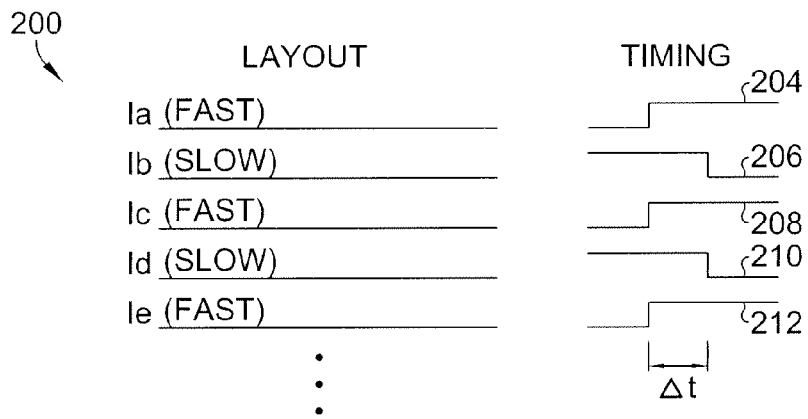
FIG. 2 is a bus including several alternating fast and slow data lines according to an embodiment of the present invention.

The present invention uses 128 data lines with no dedicated shields, but relies on the nature of the DDR3 eight bit pre-fetch to split the data bus into two groups: a fast group and a slow group. Since both groups are not switching at the same time, they appear to shield each other as long as they are physically placed in a fast-slow-fast-slow-etc. orientation. Referring now to FIG. 2, a data bus 200 according to the present invention is shown. Lines Ia through Ie alternate, wherein lines Ia, Ic, and Ie are fast data lines, and lines Ib and Id are slow data lines. The corresponding data line waveforms are shown, wherein waveforms 204, 208, and 212 step up first, and then a Δt later, waveforms 206 and 210 step down. Thus, the slow group is switched a Δt after the fast group. This Δt has to be long enough to allow the fast group to have completed switching (roughly 90% of Δv switch), but the Δt must be short enough so the slow data arrives at the output buffer in time. By using a self-timed strobe signal, with a line path that mimics the fast data path, this Δt generation has been optimized.

Figure 3:
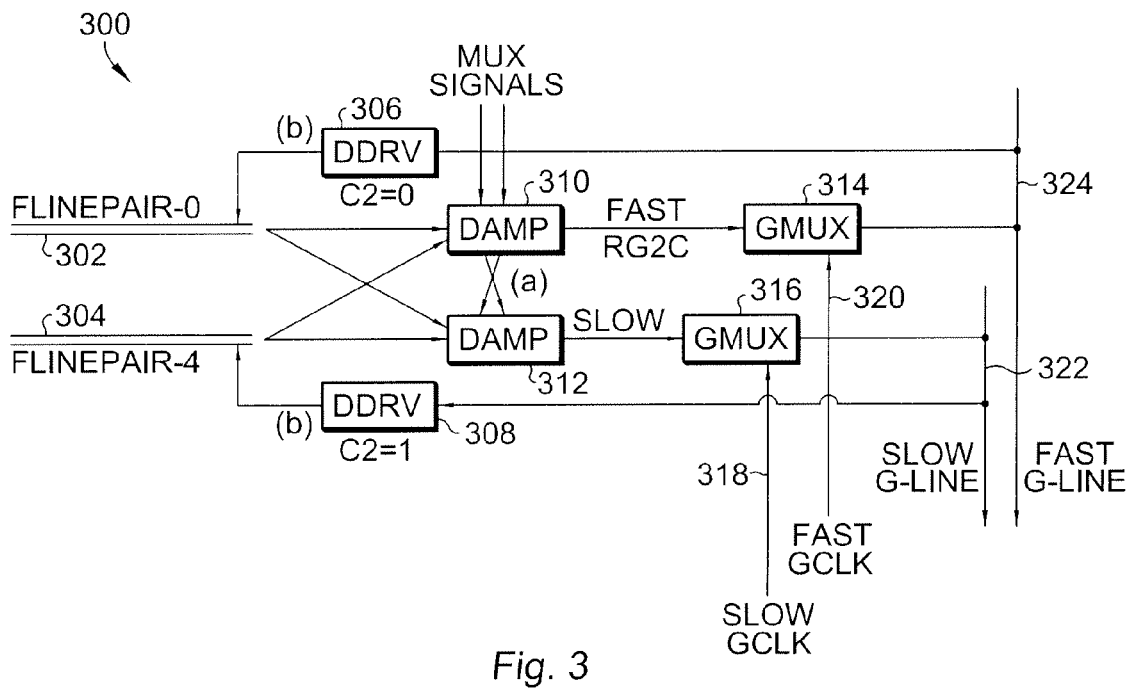
FIG. 3 is a schematic diagram of a core circuit according to the present invention for providing the alternating fast and slow data lines shown in FIG. 2.

A necessary part of the present invention is to "sort" the 8 bit/IO data from the array as soon as possible. Only if the 8 bits can be sorted into a "fast 4-bit" group and a "slow 4-bit" group can this scheme be used. For DDR3 operations the $C_2$ ($A_2$ column address) determines this. For this reason, the I/O lines inside a bank (the F-lines) are not hard-tied to a particular main data amplifier (DAMP). Instead, the I/O lines are connected to two DAMPs, each with a different $C_2$ address assignment. The sorting circuit 300 is shown in FIG. 3. Each DAMP 310 and 312 has inputs to both FLINE pairs 302 and 304. During a read sense operation either (mux=C2=0) is enabled or (mux=C2=1) is enabled. Both DAMPs 310 and 312 actually sense data and output it to their respective Gmux 314 or 316. These "muxC2" signals (labeled "MUX SIGNALS" in FIG. 3) are used only to determine from which F-line the data comes. The "muxC2" inputs are swapped for the second placement so each DAMP 306 and 308 has unique data.

Thus, if a read operation starts with C2=0, the fast DAMP 310 gets data from the $F_\varnothing$ pair 302 and outputs the data to the fast G-line 324 when the fast GCLK 320 fires. The slow DAMP 312 loads data from the $F_4$ pair 304 and outputs it to the slow Gline 322 when the slow GCLK 318 fires. If a read operation starts with C2=1, the fast DAMP 310 loads with the $F_4$ pair 304, and the slow DAMP loads with the $F_\varnothing$ pair 302. From that point operations are the same.

For writing, the fast G-line 324 is hard coded through only one DDRV to the $F_\varnothing$ pair 302, and the slow G-line 322 is hard coded to the $F_4$ pair 304 for DDR3; write operations are specified such that a "write mux" operation is not necessary here in this path.

Figure 4:
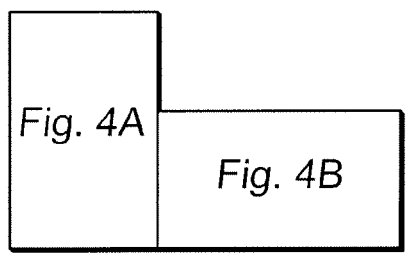
FIG. 4 is a schematic diagram of the circuit of FIG. 3 in the larger context of a DDR3 memory application.

This fast vs. slow shielding scheme continues all the way to the I/O pads as shown in FIG. 4 and described immediately below:

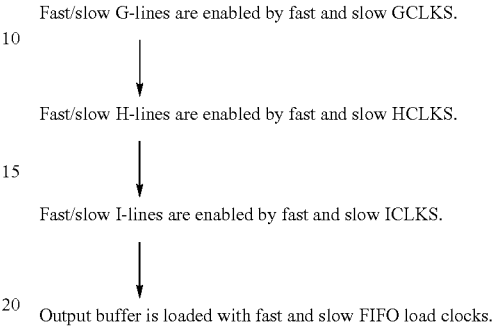

Fast/slow G-lines are enabled by fast and slow GCLKS.

Fast/slow H-lines are enabled by fast and slow HCLKS.

Fast/slow I-lines are enabled by fast and slow ICLKS.

Output buffer is loaded with fast and slow FIFO load clocks.

Figure 4A:
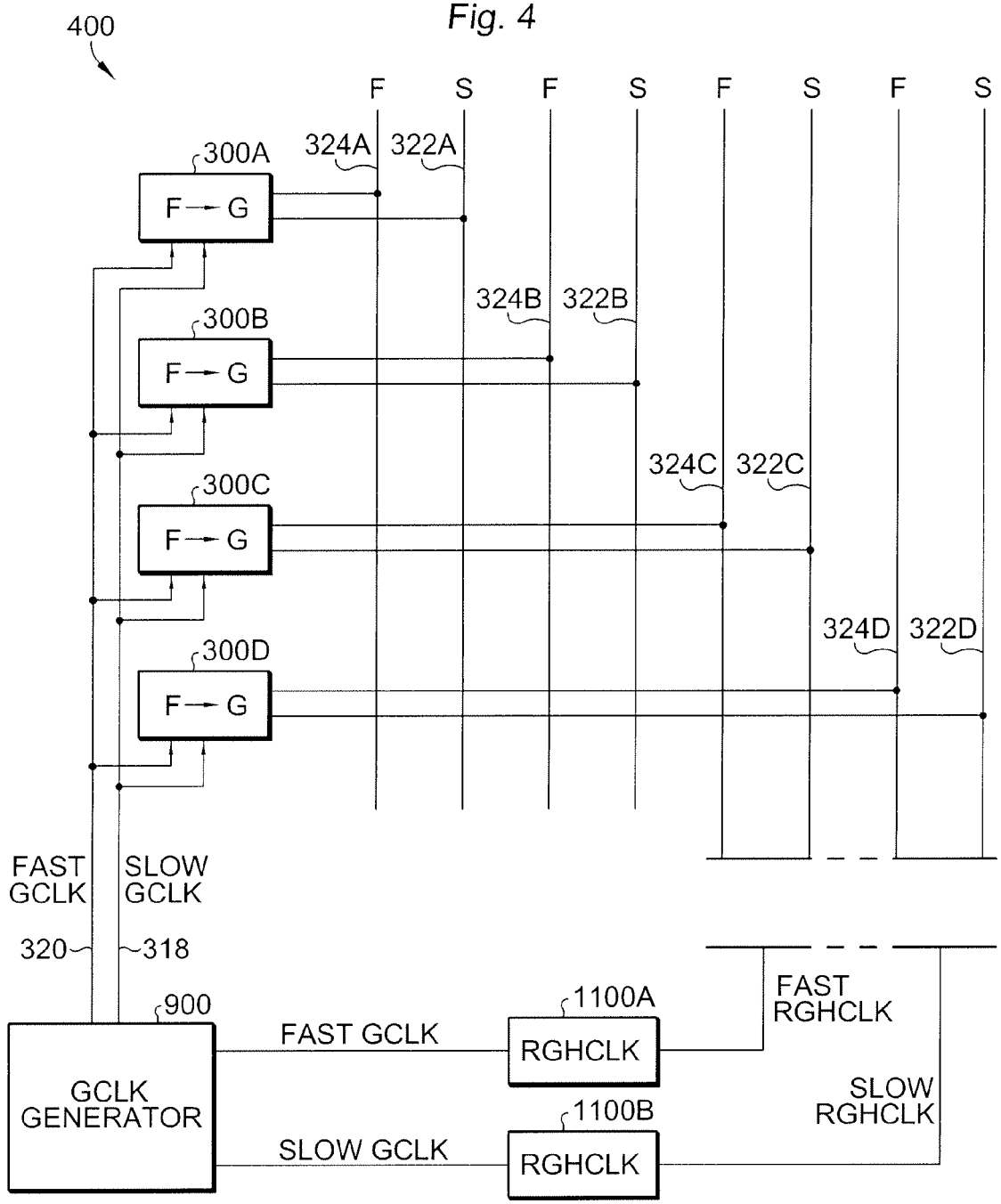
Figure 4B:
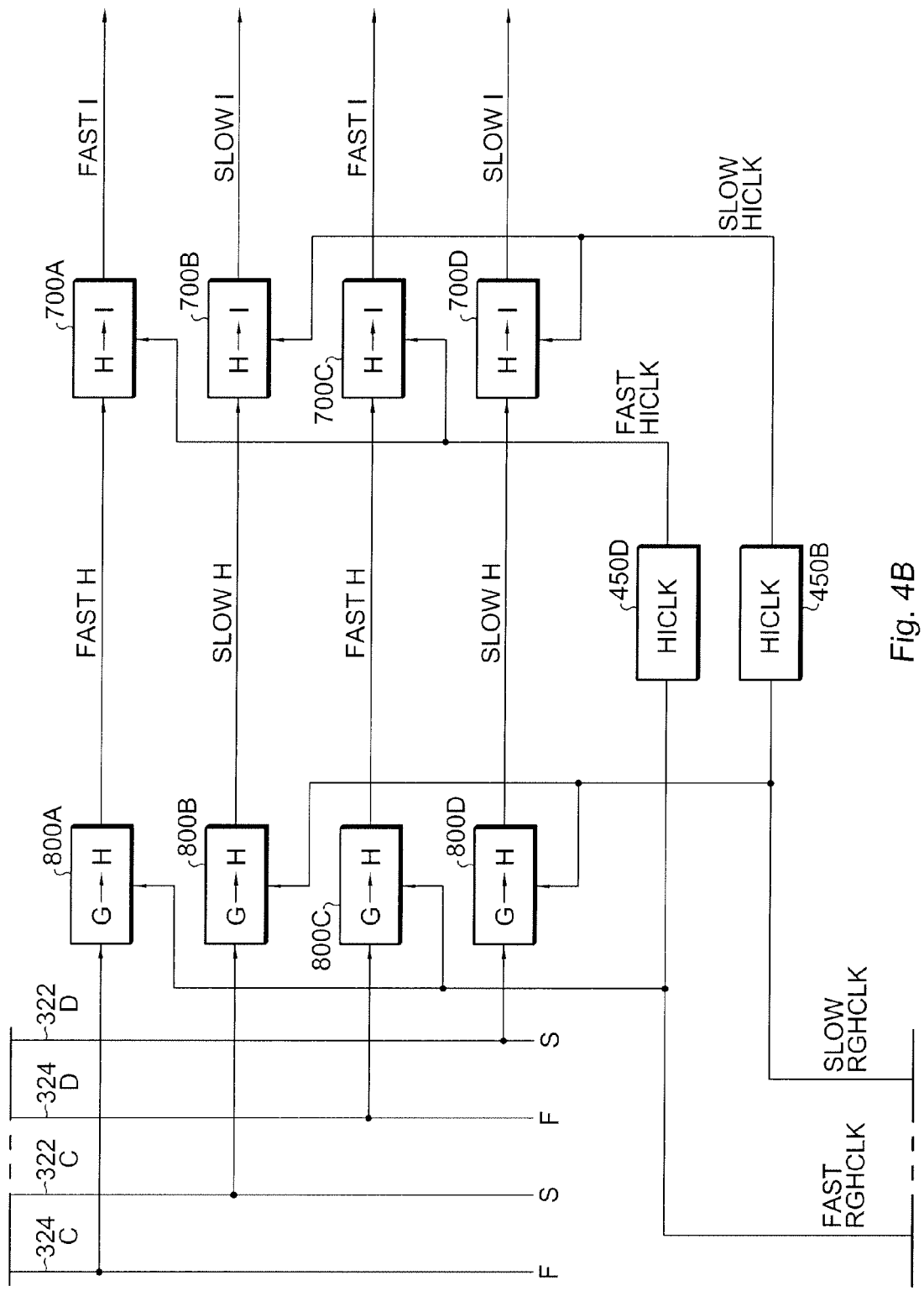

The larger context of the DDR3 memory is shown in FIG. 4 including the "F-to-G" translator/sorting circuits 300A, 300B, 300C, and 300D and fast and slow output G data lines previously described. FIG. 4A shows a GCLK generator 900 for providing the fast and slow GCLK signals on lines 320 and 318. The GCLK generator circuit 900 is described below with reference to FIG. 9. The fast and slow GCLK signals are also provided to the RGHCLK circuits 1100A and 1100B, which are also shown in FIG. 4A. The RGHCLK circuits 1100A and 1100B are described in further detail below with respect to FIG. 11. FIG. 4B shows the "G-to-H" translator circuits 800A, 800B, 800C, and 800D that receive the fast and slow G data lines and provide the output signals to the corresponding fast and slow H data lines. The translator circuits 800 are further described below with respect to FIG. 8. FIG. 4B also shows the "H-to-I" translator circuits 700A, 700B, 700C, and 700D that receive the fast and slow H data lines and provide the output signals to the corresponding fast and slow I data lines. The HICLK circuits 450A and 450B provide fast and low speed HICLK signals to the "H-to-I" translator circuits 700.

Figure 12:
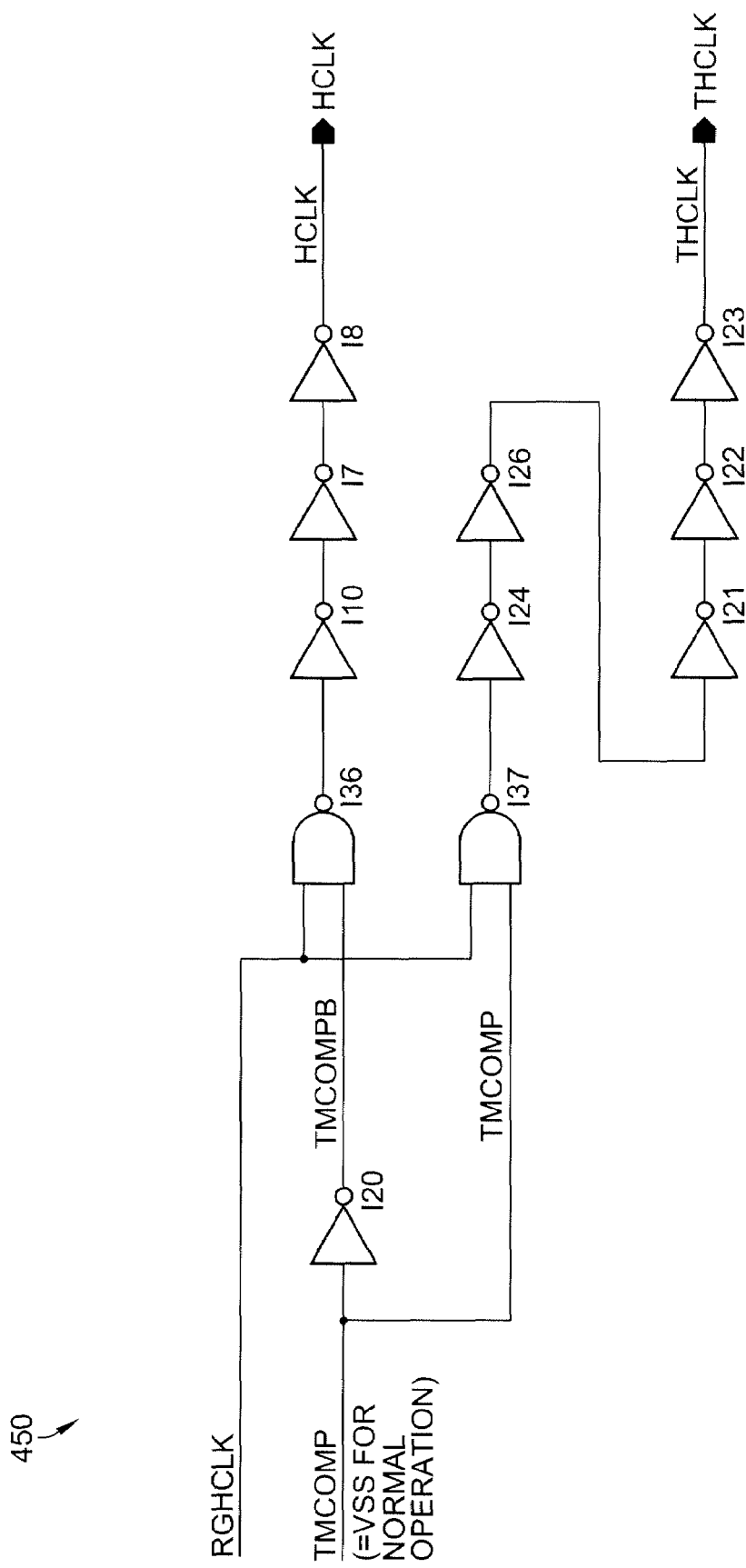
FIG. 12 is a schematic diagram of an HICLK circuit suitable for use in the circuit shown in FIG. 4.

An HICLK circuit 450 for use in FIG. 4B is shown in FIG. 12. Circuit 450 includes the RGHCLK input signal, and the TMCOMP input signal, which is set to VSS for normal operation. NAND gate I36 receives the RGHCLK signal and the TCOMPB signal from inverter I20. The output of NAND gate I36 is coupled to a serially-coupled inverter chain including inverters I10, I7, and I8 for providing the HCLK output signal. NAND gate I37 receives the RGHCLK signal and the TMCOMP signal. The output of NAND gate I37 is coupled to a serially-coupled inverter chain including inverters I24, I26, I21, I22, and I23 for providing the delayed THCLK signal.

Referring back to FIG. 3, once the data has been sorted by the DAMP circuits 310 and 312 into fast/slow groups, these groups maintain themselves and stay separate all the way to the output buffer. To maintain the shielding scheme, a fast line is always surrounded by two slow lines and vice-versa.

Figure 5:
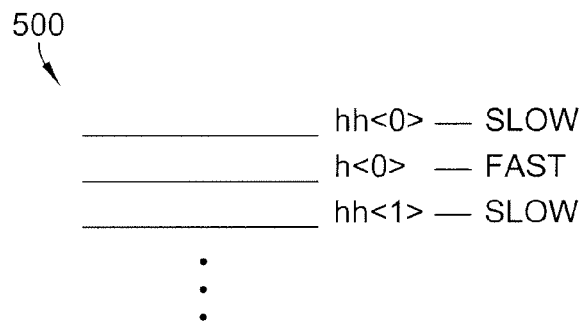
FIG. 5 is a schematic diagram of alternating fast and slow "H" data lines according to an embodiment of the present invention.

Referring now to FIG. 5, within a 4-bit group (fast or slow) further sorting and muxing may be done, but bits never cross from the fast to slow or vice-versa. As shown in FIG. 5, a group 500 of HCLK signals is sub-sorted into hh<0> SLOW, h<0> FAST, and hh<1> SLOW data lines. Further examples: C1C0 sorting is done in conjunction with G bus to H bus transition and ×4/×8 muxing is done at the H bus and I bus transition point. The fast and slow groups handle this within themselves.

Figure 6:
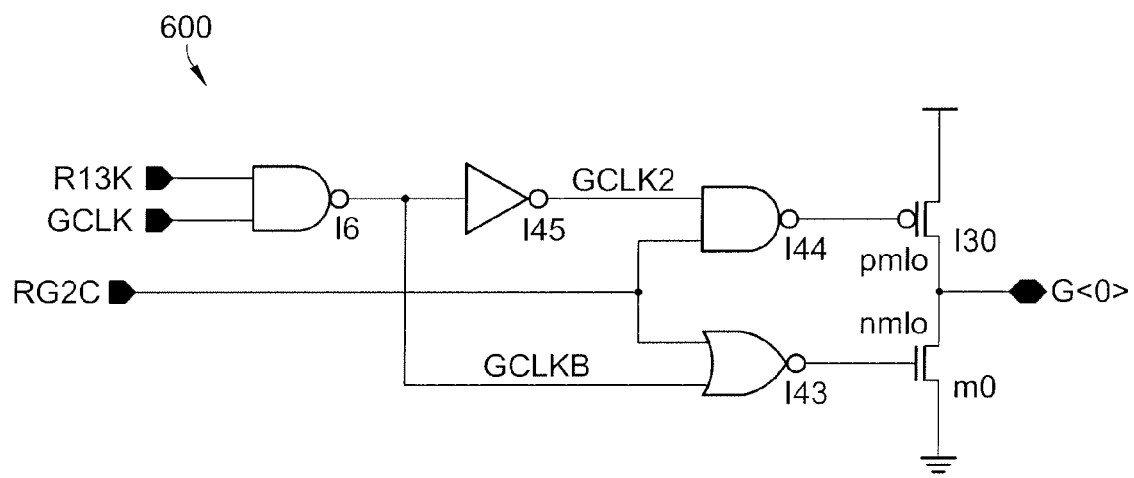
FIG. 6 is a schematic diagram of a multiplexer circuit suitable for use in the circuits shown in FIGS. 3 and 4.

Referring now to FIG. 6, an example of a GMUX circuit 600 is shown suitable for use as either GMUX 314 or GMUX 316 shown in FIG. 3. GMUX circuit 600 includes NAND gate I6 for receiving the R13K and GCLK signals and for generating the GCLKB signal. The R13K signal is a master data select address based on the A13 row address and is not part of the critical timing. That is, inverter I6 is fixed either high or low prior to any data operations. The RG2C signal is the 'data signal' from the DAMP to the GMUX, see FIG. 3. Inverter I45 receives the GCLKB signal and generates the GCLK2 signal. NOR gate I43 receives the GCLKB and RG2C signals. NAND gate I44 receives the GCLK2 and GCLKB signals. The gate of transistor I30 is driven by the output of NAND gate I44 and the gate of transistor M0 is driven by the output of NOR gate I43. The coupled drains of transistors I30 and M0 provide the G<0> output signal.

Figure 7:
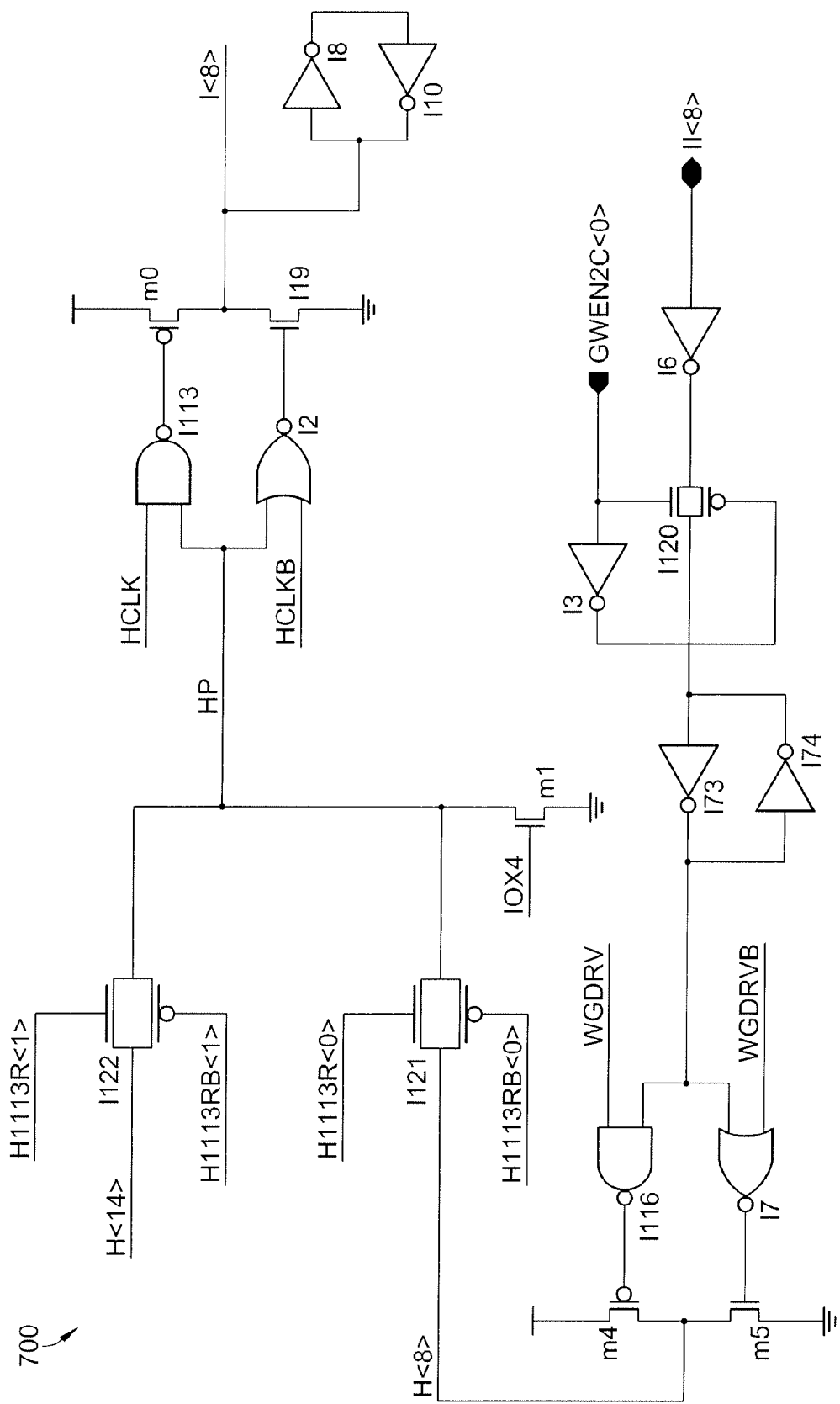
FIG. 7 is a schematic diagram of an "H-to-I" data line translator circuit suitable for use in the circuit shown in FIG. 4.

Referring now to FIG. 7, the "H-to-I" translator circuit 700 is shown, which is suitable for use as any of the "H-to-I" circuits 700A, 700B, 700C, or 700D shown in FIG. 4B. Circuit 700 is used to drive an H-line to an I-line during read operations. The timing of the drive operation is controlled by the HCLK signal. During read operations a particular H-line may be selected from a group of H-lines in order to perform multiplexer operations related to operating the device on an ×4 or ×8 I/O device. The H1113R<0:1> and their complements perform this function. The circuit 700 also serves to drive the I-line data (e.g. II<8>) onto an H-line (e.g. H<8>) during write operations based on the WGDRV, WGDRVB, and GWEN2C<0> signals. Write operations are not described. Passgate I122 receives an exemplary input H signal H<14> and is passed to the output of passgate I122 with control signals H1113R<1> and H1113RB<1>. The HP output signal is coupled to the inputs of NAND gate I113 and NOR gate I2. NAND gate I113 also receives an HCLK input signal, and NOR gate I2 also receives an HCLKB input signal. The output of NAND gate I113 is coupled to the gate of transistor M0 and the output of NOR gate I2 is coupled to the gate of transistor I19. Transistors M0 and I19 generate the I<8> signal, which is latched by cross-coupled inverter latch I8/I10. Circuit 700 also receives the II<8> and GWEN2C<0> signals. Passgate I120 receives the inverted II<8> signal through inverter I6 and is controlled by the GWEN2C<0> and inverted GWEN2C<0> signal through inverter I3. The output of pass-gate I120 is passed through cross-coupled inverter latch I73/I74 to the input of NAND gate I116 and NOR gate I7. NAND gate I116 also receives the WGDRV signal and NOR gate I7 also receives the WGDRVB signal. The output of NAND gate I116 drives the gate of transistor M4 and the output of NOR gate I7 drives the gate of transistor M5. Transistors M4 and M5 generate the H<8> signal, which is received by the input of passgate I121. Passgate I121 is controlled by the H1113R<0> and H1113RB<0> control signals. The output of pass-gate I121 is also coupled to the HP node. The drain of transistor M1 is also coupled to the HP node and selectively pulls the HP node to ground under the control of the IOX4 signal.

Figure 8:
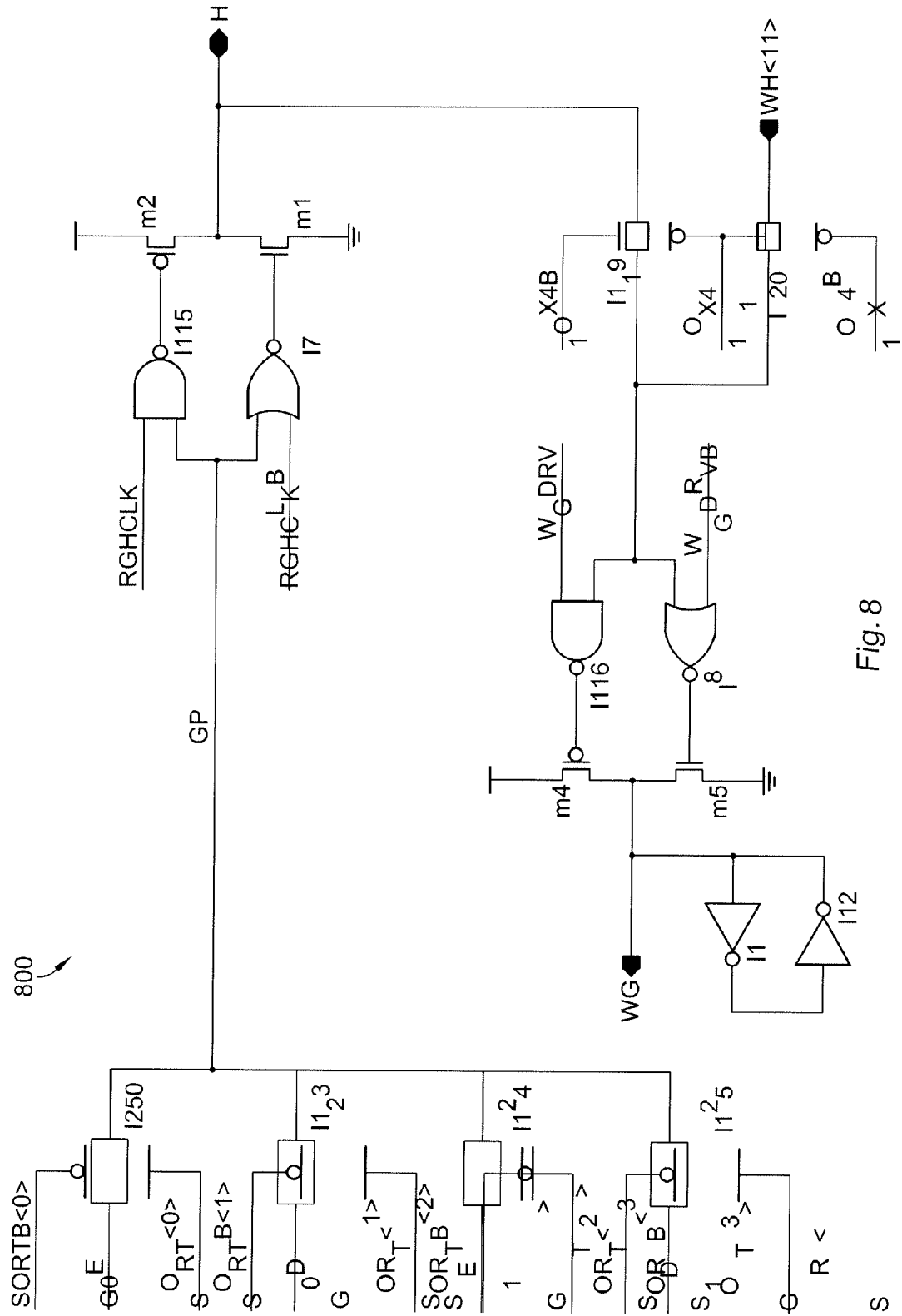
FIG. 8 is a schematic diagram of a "G-to-H" data line translator circuit suitable for use in the circuit shown in FIG. 4.

Referring now to FIG. 8, circuit 800 can be used for any of the "G-to-H" translator circuits 800A, 800B, 800C, or 800D shown in FIG. 4B, which are used to drive a G-line to an H-line during read operations, the timing of which is controlled by the RGHCLK. A particular G-line is selected from a group based on the SORT/SORTB signals. This executes the data sorting based on the C1 and C0 column addresses. The circuit 800 also serves to drive the H-line onto the G-line (WG) during write operations. Passgates I250, I123, I124, and I125 respectively receive the G0E, G0D, G1E, and G1D input signals. The same passgates are respectively controlled by the SORT<0>/SORTB<0>, SORT<1>/SORTB<1>, SORT<2>/SORTB<2>, and SORT<3>/SORTB<3> control signals. The common output of the passgates is the GP node, which is coupled to an input of NAND gate I115 and NOR gate I7. The other input of NAND gate I115 receives the RGHCLK signal, and the other input of NOR gate I7 receives the RGHCLKB signal. The output of NAND gate I115 drives the gate of transistor M2 and the output of NOR gate I7 drives the gate of transistor M1. Transistors M1 and M2 generate the H signal. Circuit 800 also receives the WH<11> signal. Passgate I119 receives the H signal and passgate I120 receives the WH<11> signal. Passgates I119 and I120 are controlled by the IOX4 and IOX4B control signals. The coupled outputs of passgates I119 and I120 drive the coupled inputs of NAND gate I116 and NOR gate I8. The other input of NAND gate I116 receives the WGDRV signal, and the other input of NOR gate I8 receives the WGDRVB signal. The output of NAND gate I116 drives the gate of transistor M4 and the output of NOR gate I8 drives the gate of transistor M5. Transistors M4 and M5 generate the WG signal, which is latched by coupled inverter latch I1/I2.

Figure 9:
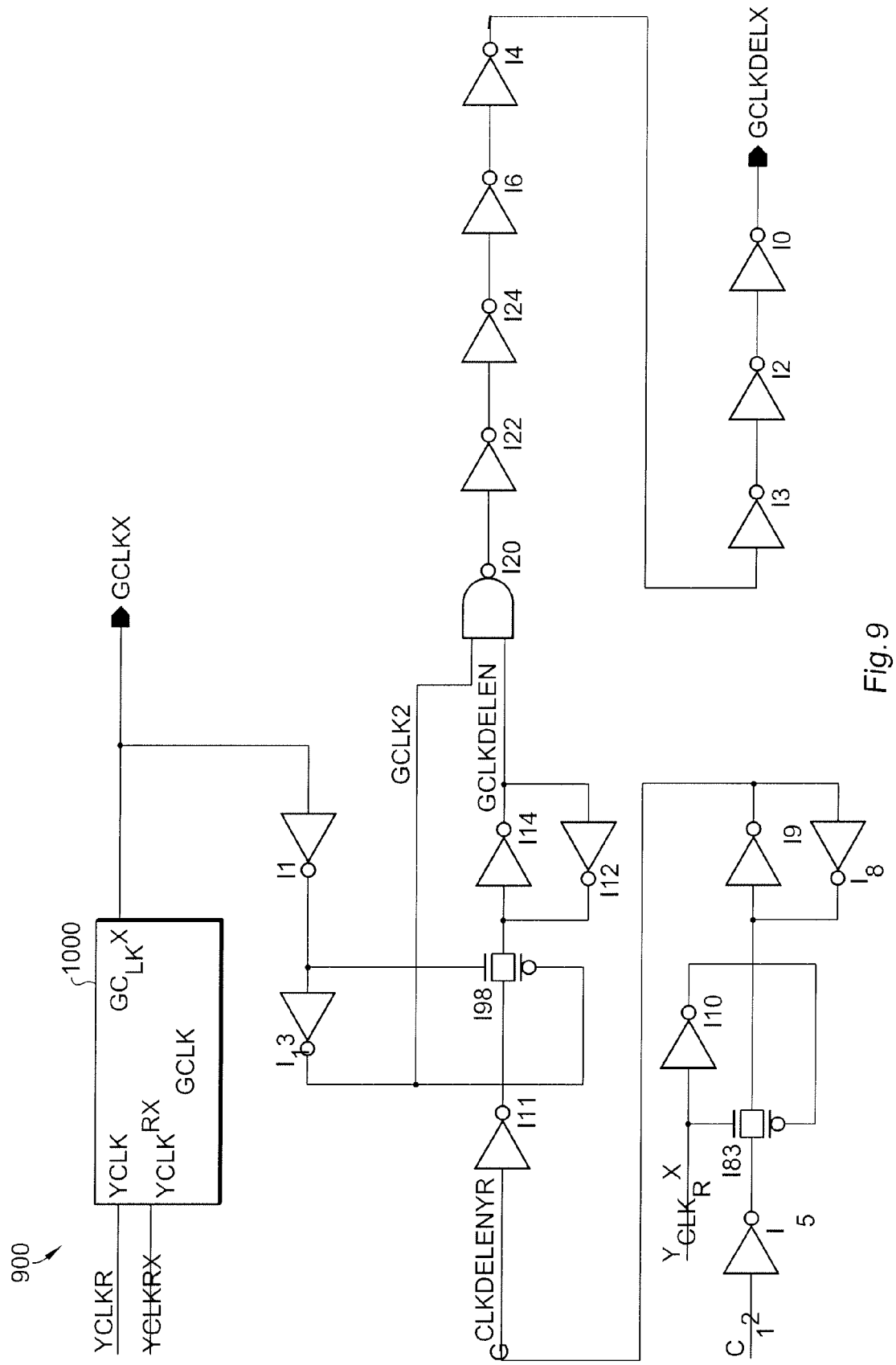
FIG. 9 is a schematic diagram of a GCLK generator circuit suitable for use in the circuit shown in FIG. 4.

Referring now to FIG. 9, a GCLK generator 900 is shown suitable for use as the GCLK generator in FIG. 4A. The GCLK generator block 1000 is described in further detail with respect to FIG. 10, and receives the YCLKR and YCLKRX signals, and generates the "fast" GCLKX clock signal. The "slow" GCLKDELX clock signal is derived from the "slow" GCLKX signal. Inverter I1 receives the GCLKX signal and the output thereof is coupled to the input of inverter I13. The outputs of inverters I1 and I13 are used to control passgate I98. The input of passgate I98 receives the GCLKDELENYR signal through inverter I1. The GCLKDELENYR signal is derived from the YCLKRX and C12 signals through inverter I5, passgate I83, inverter I10, and cross-coupled inverter latch I8/I9. The output of passgate I98 is received by cross-coupled inverter latch I12/I14 to generate the GCLKDELEN signal. Inverter I13 provides the GCLK2 signal. NAND gate I20 receives the GCLKDELEN and GCLK2 signals and generates an output signal. The output signal is delayed by a delay chain comprised of coupled inverters I22, I24, I6, I4, I3, I2, and I0. The output of the delay chain is the "slow" GCLKDELX clock signal.

Figure 10A:
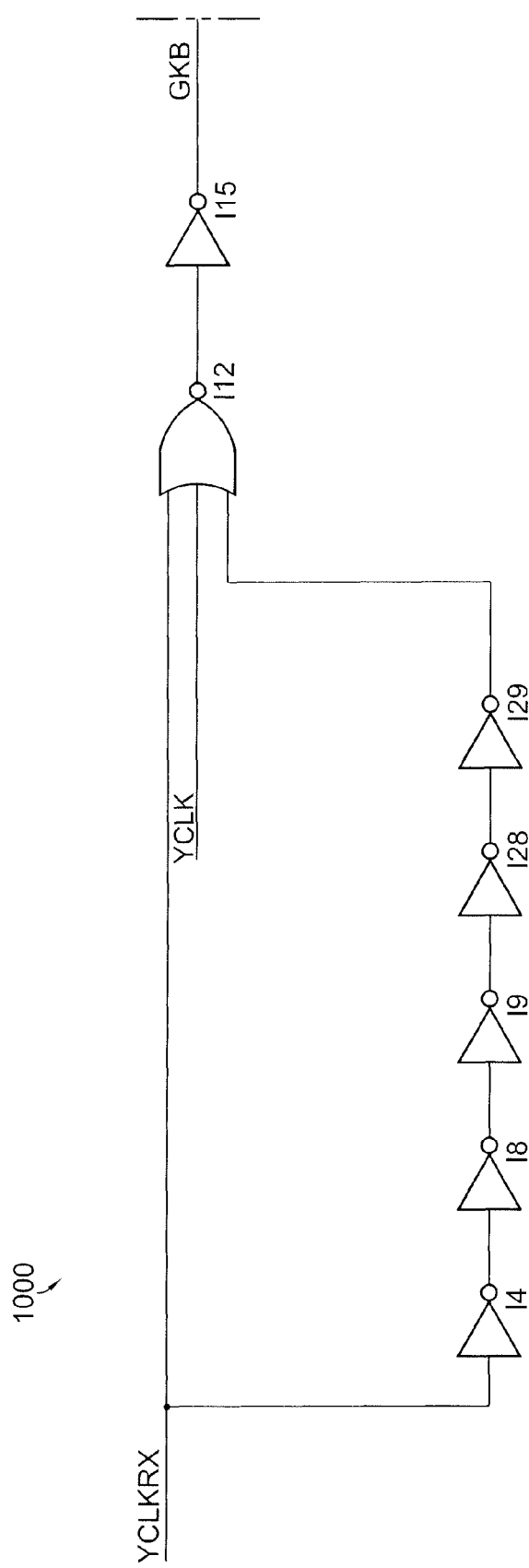
FIG. 10 is a schematic diagram of a GCLK generator circuit sub-block suitable for use in the circuit shown in FIG. 9.
Figure 10B:
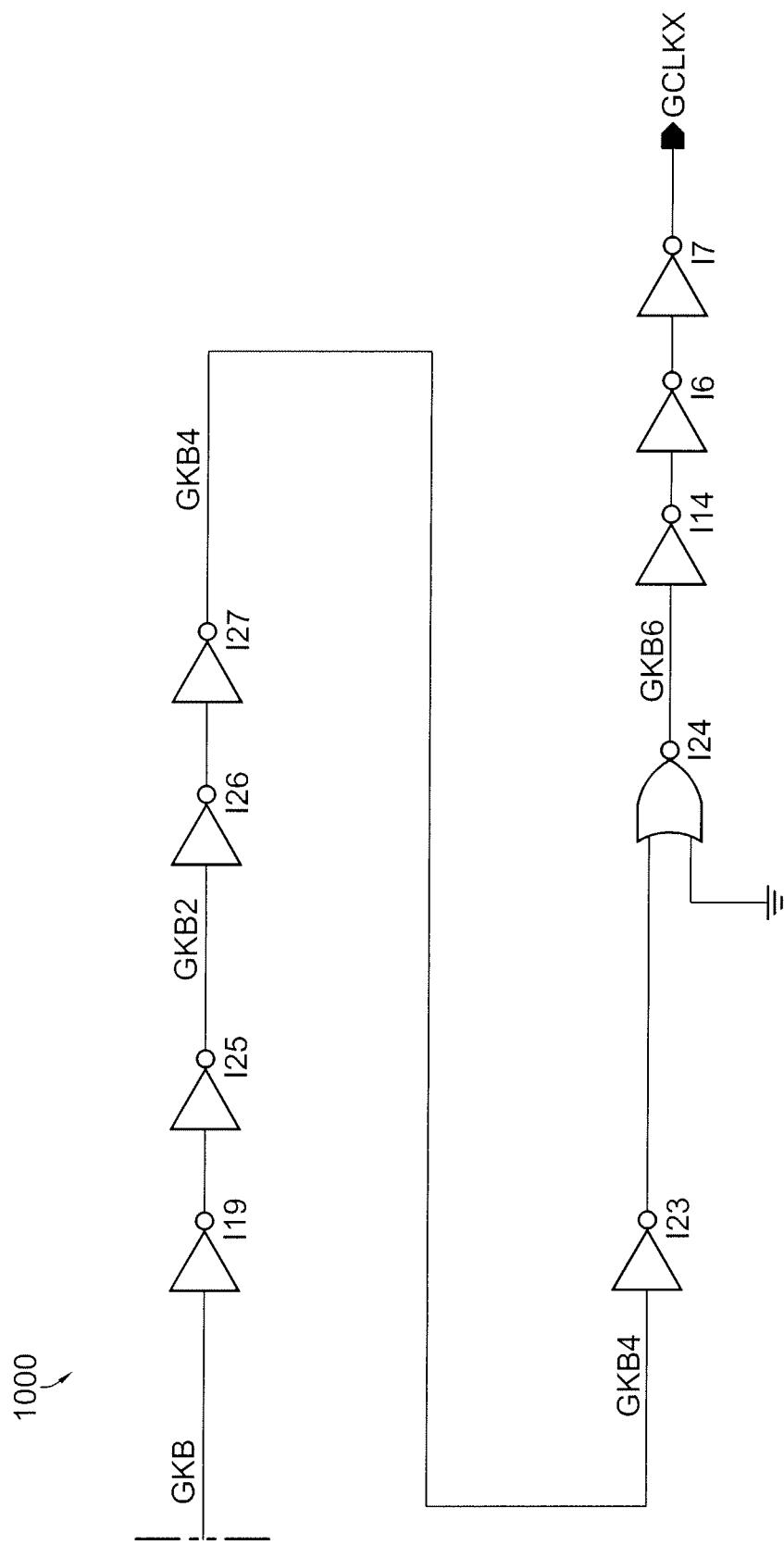

Referring now to FIG. 10, the basic core GCLK generator block 1000 is shown in greater detail. In FIG. 10A, NOR gate I12 receives the YCLKRX and YCLK signals, as well as the output from the delay chain comprising delay stages I4, I8, I9, I28, and I29. In FIGS. 10A and 10B, the output of NOR gate I12 is passed through another delay chain comprising I15, I19, I25, I26, and I27 to generate the GKB4 signal, which is coupled to the input of inverter I23. Inverter I25 generates the GKB2 signal and inverter I27 generates the GKB4 signal. The output of inverter I23 is coupled to an input of NOR gate I24, the other input of which is shorted to ground. The output of NOR gate I24 generates the GKB6 signal, which is received by coupled inverters I14, I6, and I7 to generate the GCLKX signal also shown in FIG. 9.

Figure 11:
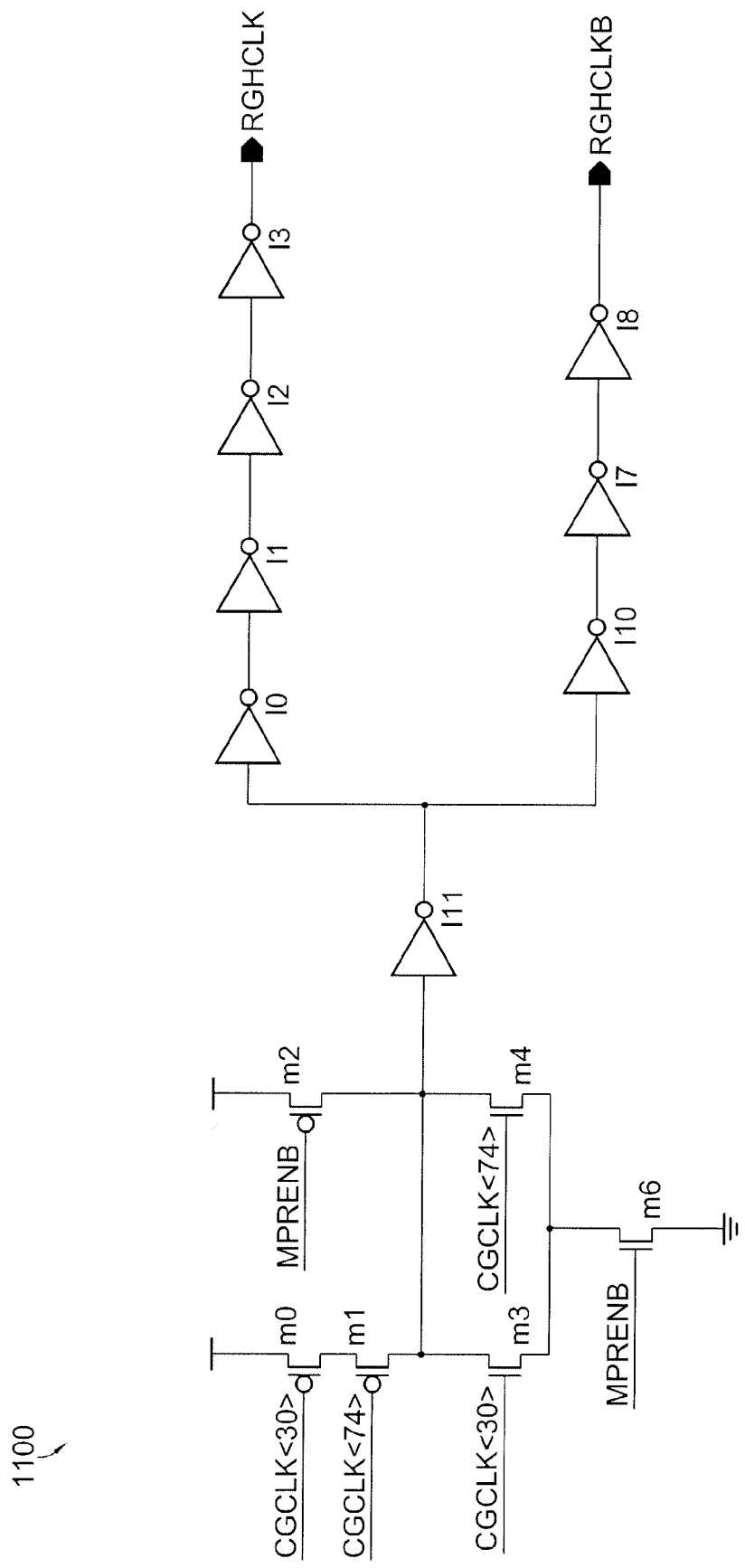
FIG. 11 is a schematic diagram of a RGHCLK generator circuit suitable for use in the circuit shown in FIG. 4.

Referring now to FIG. 11, the RGHCLK circuit 1100 is shown, which is used to time the transfer of the G-line data to the H-line bus. When the RGHCLK is asserted high, the correct G-line(s) will be driven to the correct H-line(s) via the plurality of "G-H" translator circuits 800. Circuit 1100 can be used as circuits 1100A and 1100B shown in FIG. 4A. An input digital circuit includes P-channel transistor M0 for receiving the CGCLK<30> signal, P-channel transistor M1 for receiving the CGCLK<47>, and P-channel transistor M2 for receiving the MPRENB signal. N-channel transistor M3 receives the CGCLK<30> signal, N-channel transistor M4 receives the CGLK<74> signal, and N-channel transistor M6 receives the MPRENB signal. The output of the input digital circuit is loaded with delay stage I11. A first delay chain including delay stages I0, I1, I2, and I3 provides the RGHCLK signal. A second delay chain including delay stages I10, I7, and I8 provides the complementary RGHCLKB signal.

A Key Terms List is provided for further detailed description of the invention.

Bank—A group of memory sub-arrays with a distinct address. Banks are typically arranged in a memory such that different banks can have different row addresses activated at the same time. For a read operation, all the bits for a given prefetch size are sensed and sent to the main amplifiers simultaneously. This is essentially necessary to maintain synchronization with the column address bus and any possible precharge requirements.

Main Amplifier—As the data lines connecting to all the sense-amps within a bank become heavily loaded (capacitance), they are usually made up of a differential pair which carries only small voltage differences for reading. As such, these differences must be sensed by a "main" amplifier other than the column sense-amp that actually connects to the bit-lines. In the present invention chip these bank data lines are referred to as the F line. (F and F-bar). Sense-amp band—Interfacing to each column of a sub-array is a sense-amp. Each sense-amp senses the bit-bitbar differential when a row in that sub-array is activated for possible future reading purposes. All the sense-amps stacked together for a sub-array comprise a sense-amp band. Sense-amps are typically bi-directional, having the ability to connect to the columns in the sub-array on each side of it, therefore one sense-amp band typically divides two sub-arrays.

I/O pins—The point of the design that actually communicates data to the network outside the chip. I/O pins are also called DQ pins. These drive data in (I) when writing and drive data out when reading (O).

Chip datapath or databus—The datalines that connect the banks to the I/O pins. At least one line per I/O pin is necessary, but in the present invention there are eight per I/O pin as the bank must pre-fetch 8 bits for each read command. To achieve the high rate, the data pin is pipelined through the chip by various clocks, and therefore the bus, is segmented into sections, G-bus, H-bus, I-bus. The present invention divides these busses in half, fast versus slow.

G-bus=fast, GG-bus=slow
H-bus=fast, HH-bus=slow
I-bus=fast, II-bus=slow

Y-select—The column select line; this is based on the decoded column address input to the chip for read or write operation.

GCLK—Clock that enables data to flow from the main amplifier (bank based) to the global G-bus.

GHCLK—Clock that enables data to travel from the G-bus to the H-bus.

HICLK—Clock that enables data to travel from the H-bus to the I-bus.

FICLK—Clock that controls the input of the data on the I-lines into the FIFO register assigned to each individual I/O buffer.

While there have been described above the principles of the present invention in conjunction with a specific circuit, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. A data bus structure for a data bus comprising:
   a first data bus group associated with a first non-zero speed requirement;
   a second data bus group associated with a second non-zero speed requirement different from the first data bus group;
   sorting circuitry for assigning input data to either the first data bus group and to the second data bus group, respectively, or to the second data bus group and to the first data bus group, respectively, depending upon the relative non-zero speed characteristics of the input data;
   a first multiplexer for receiving data from the first data bus group having an input for receiving a first clock signal, and an output coupled to a first data output line; and
   a second multiplexer for receiving data from the second data bus group having an input for receiving a second clock signal, and an output coupled to a second data output line.

2. The data bus structure of claim 1 wherein the first and second data bus groups are physically interleaved.

3. The data bus structure of claim 2 wherein individual lines in the data bus are interleaved such that at least one line from the first data bus group is surrounded by two lines from the second data bus group.

4. The data bus structure of claim 2 wherein individual lines in the data bus are interleaved such that at least one line from the second data bus group is surrounded by two lines from the first data bus group.

5. The data bus structure of claim 1 wherein the first and second groups are switched at different times.

6. The data bus structure of claim 1 comprising a plurality of data bus segments wherein the first and second groups of each data bus segment are switched at different times.

7. A method for transmitting data on a data bus comprising:
   providing a first data bus group associated with a first non-zero speed requirement;
   providing a second data bus group associated with a non-zero second speed requirement different from the first data bus group;
   assigning input data to either the first data bus group and to the second data bus group, respectively, or to the second data bus group and to the first data group, respectively, depending upon the relative non-zero speed characteristics of the input data;
   providing a first multiplexer for receiving data from the first data bus group having an input for receiving a first clock signal, and an output coupled to a first data output line; and providing a second multiplexer for receiving data from the second data bus group having an input for receiving a second clock signal, and an output coupled to a second data output line.

8. The method of claim 7 further comprising physically interleaving the first and second data bus groups.

9. The method of claim 7 further comprising interleaving individual lines in the data bus such that a line from the first data bus group is surrounded by two lines from the second data bus group.

10. The method of claim 7 further comprising interleaving individual lines in the data bus such that a line from the second data bus group is surrounded by two lines from the first data bus group.

11. The method of claim 7 further comprising switching the first and second groups at different times.

12. The method of claim 7 further comprising switching the first and second groups in a plurality of data bus segments at different times.

13. A data bus driver circuit comprising:
a first data line;
a second data line;
a first data amplifier coupled to the first and second data lines;
a second data amplifier coupled to the first and second data lines;
circuitry for assigning data from the first data line to either the first or second data amplifier and data from the second data line to either the second or first data amplifier based upon the relative speed characteristics of the data on the first and second data lines;
a first multiplexer coupled to the output of the first data amplifier having an input for receiving a first clock signal, and an output coupled to a first data output line;
a second multiplexer coupled to the output of the second data amplifier having an input for receiving a second clock signal, and an output coupled to a second data output line;
a first data driver circuit having an input coupled to the first data output line and an output coupled to the first data line; and
a second data driver circuit having an input coupled to the second data output line and an output coupled to the second data line.

14. A data bus driver circuit comprising:
a plurality of data amplifier circuit pairs wherein each pair is coupled to first and second input data lines and to first and second output data lines;
a clock generator for providing a first clock signal to a first data amplifier in each data amplifier pair and a second clock signal to a second data amplifier in each data amplifier pair;
circuitry for assigning data from the first and second data input lines to either the first and second data amplifier in the data amplifier pair or to the second and first data amplifier in the data amplifier pair based upon the relative non-zero speed characteristics of the first and second input data lines;
a first multiplexer coupled to the output of the first data amplifier having an input for receiving the first clock signal, and an output coupled to a first data output line; and
a second multiplexer coupled to the output of the second data amplifier having an input for receiving the second clock signal, and an output coupled to a second data output line.

15. The data bus driver circuit of claim 14 wherein the first and second output data lines from the plurality of data amplifier pairs are interleaved.

16. The data bus driver circuit of claim 14 further comprising an additional driver circuit coupled to the data output lines for driving an additional set of data output lines.

17. The data bus driver circuit of claim 16 wherein the additional set of data output lines is interleaved based upon the relative speed characteristic of the additional data lines.

* * * * *